(12) United States Patent
Erhart et al.

(10) Patent No.: US 11,605,945 B2
(45) Date of Patent: Mar. 14, 2023

(54) PYRO IGNITER CIRCUIT AND TESTING METHOD

(71) Applicant: Samsung SDI Co., Ltd., Yongin-si (KR)

(72) Inventors: Michael Erhart, Seiersberg-Pirka (AT); Wolfgang Reinprecht, Attendorf (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 93 days.

(21) Appl. No.: 17/202,764

(22) Filed: Mar. 16, 2021

(65) Prior Publication Data
US 2021/0296884 A1    Sep. 23, 2021

(30) Foreign Application Priority Data

Mar. 18, 2020 (EP) ..................................... 20163833
Mar. 9, 2021 (KR) .......................... 10-2021-0030949

(51) Int. Cl.
*H02H 7/18* (2006.01)
*H02H 1/00* (2006.01)
*G01R 31/327* (2006.01)
*G01R 31/00* (2006.01)
*H02H 3/08* (2006.01)

(52) U.S. Cl.
CPC ............. *H02H 7/18* (2013.01); *G01R 31/006* (2013.01); *G01R 31/3277* (2013.01); *H02H 1/00* (2013.01); *H02H 3/08* (2013.01)

(58) Field of Classification Search
CPC ................. H01H 39/006; H01H 85/38; H01H 2039/008; H01H 85/0241
See application file for complete search history.

(56) References Cited

U.S. PATENT DOCUMENTS

| 4,873,603 A | 10/1989 | Ishii |
| 4,990,854 A | 2/1991 | Friz |
| 6,191,589 B1 | 2/2001 | Clunn |
| 2004/0113745 A1* | 6/2004 | Lell ...................... H01H 39/006 337/157 |
| 2005/0127879 A1 | 6/2005 | Sato et al. |

(Continued)

FOREIGN PATENT DOCUMENTS

| DE | 10 2004 019 817 A1 | 11/2005 |
| DE | 10 2012 214 835 A1 | 2/2014 |

(Continued)

OTHER PUBLICATIONS

Extended European Search Report issued in corresponding EP Application No. 20163833.5, dated May 18, 2020, 5 pages.

*Primary Examiner* — Jermele M Hollington
*Assistant Examiner* — Temilade S Rhodes-Vivour
(74) *Attorney, Agent, or Firm* — Lewis Roca Rothgerber Christie LLP

(57) ABSTRACT

A pyro igniter circuit and a method for testing the same is provided. The pyro igniter circuit includes a supervisory circuit configured to: transmit a test signal having a pulse duration time below an igniter activation pulse time of a pyro igniter disconnect element and/or an ignition control signal, in response to the transmitted test signal, has an amplitude below an igniter activation amplitude of the pyro igniter disconnect element; and receive a diagnostic response signal in response to the transmitted test signal.

17 Claims, 3 Drawing Sheets

(56) References Cited

U.S. PATENT DOCUMENTS

| | | | | |
|---|---|---|---|---|
| 2013/0154352 | A1* | 6/2013 | Tokarz | B60L 3/0046 |
| | | | | 307/9.1 |
| 2015/0130295 | A1* | 5/2015 | Sack | H02H 9/001 |
| | | | | 307/131 |
| 2016/0336131 | A1* | 11/2016 | Fellmer | H01H 33/182 |
| 2018/0147941 | A1* | 5/2018 | Kube | H02H 7/18 |
| 2018/0284193 | A1 | 10/2018 | Wandres et al. | |
| 2018/0294635 | A1 | 10/2018 | Kozuki et al. | |
| 2019/0123542 | A1* | 4/2019 | Kambham | H02H 3/087 |

FOREIGN PATENT DOCUMENTS

| | | |
|---|---|---|
| EP | 0 330 148 B1 | 9/1994 |
| EP | 1 531 535 A2 | 5/2005 |
| WO | WO 88/02491 A1 | 4/1988 |
| WO | WO 2006/117550 A1 | 11/2006 |
| WO | WO 2019/084304 A1 | 5/2019 |

* cited by examiner

PYRO IGNITER CIRCUIT AND TESTING METHOD

CROSS-REFERENCE TO RELATED APPLICATION

This application claims priority to and the benefit of European Patent Application No. 20163833.5, filed in the European Patent Office on Mar. 18, 2020, and Korean Patent Application No. 10-2021-0030949, filed in the Korea Intellectual Property Office on Mar. 9, 2021, the entire content of all of which are incorporated herein by reference.

BACKGROUND

1. Field

Aspects of embodiments of the present disclosure relate to a pyro igniter circuit and a testing method for testing a pyro igniter circuit.

2. Related Art

In recent years, vehicles for transportation of goods and peoples have been developed that use electric power as a source for motion. An electric vehicle is an automobile that is propelled by an electric motor using energy stored in rechargeable batteries. The electric vehicle may be solely powered by rechargeable batteries or may be a hybrid vehicle powered by, for example, a gasoline generator. Furthermore, the electric vehicle may include a combination of electric motor and conventional combustion engine.

Generally, an electric-vehicle battery (EVB), or traction battery, is a battery used to power the propulsion of battery electric vehicles (BEVs). Electric-vehicle batteries differ from starting, lighting, and ignition batteries because they are designed to give power over sustained periods of time. A rechargeable, or secondary, battery differs from a primary battery in that it is designed to be repeatedly charged and discharged, while the latter is designed to provide an irreversible conversion of chemical to electrical energy. Low-capacity rechargeable batteries are used as power supplies for small electronic devices, such as cellular phones, notebook computers, and camcorders, while high-capacity rechargeable batteries are used as power supplies for hybrid vehicles and the like.

Generally, rechargeable batteries include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the battery via an electrochemical reaction between the positive electrode, the negative electrode, and the electrolyte solution. The shape of the case, such as cylindrical or rectangular, depends on the battery's intended purpose. Lithium-ion (and similar lithium polymer) batteries, widely known via their use in laptops and consumer electronics, dominate the most recent electric vehicles in development.

Rechargeable batteries may be used as a battery module including a plurality of unit battery cells coupled to each other in series and/or in parallel to provide a high energy density, for example, for motor driving of a hybrid vehicle. For example, the battery module is formed by interconnecting the electrode terminals of the plurality of unit battery cells in a manner based on a desired amount of power and to realize a high-power rechargeable battery.

A battery pack is a set of any number of (preferably identical) battery modules. The battery modules may be configured in series, parallel, or a mixture of both to deliver the desired voltage, capacity, or power density. Components of the battery pack include the individual battery modules and the interconnects, which provide electrical conductivity between the battery modules.

A static control of battery power output and charging is generally not sufficient to meet the dynamic power demands of various electrical consumers connected to the battery system. Thus, steady exchange of information between the battery system and the controllers of the electrical consumers may be employed. Such information may include the battery system's state of charge (SoC), potential electrical performance, charging ability, and internal resistance as well as actual or predicted power demands or surpluses of the consumers.

Battery systems usually include a battery management system (BMS) and/or battery management unit (BMU) for processing the aforementioned information. The BMS/BMU may communicate with the controllers of the various electrical consumers via a suitable communication bus, such as a SPI or CAN interface. The BMS/BMU may further communicate with each of the battery submodules, for example, with a cell supervision circuit (CSC) of each battery submodule. The CSC may be further connected to a cell connection and sensing unit (CCU) of a battery submodule that interconnects the battery cells of the battery submodule.

Thus, the BMS/BMU is provided for managing the battery pack and may protect the battery pack from operating outside its safe operating area, monitoring its state, calculating secondary data, reporting that data, controlling its environment, authenticating it, and/or balancing it.

In case of severe fault conditions, the battery should be disconnected or shut down immediately to prevent uncontrolled heat or even fire. In battery systems, pyro igniter elements or, in other words, pyro-fuses can be used, which cut the power line based on an ignition control signal that is generated in response to a detected severe fault condition. The cutting of the power line by the pyro igniter element is conventionally performed by a rapid pyro reaction, which requires and activation.

According to the related art, pyro igniter circuits include integrated diagnosis systems, which supervise the amplifying comparators and the release/activation circuit of the pyro igniter element. Current solutions consist of checking the internal integrity of the control circuit in terms of functionality rather than the complete circuit loop to fire the pyro-fuse element.

SUMMARY

Aspects of embodiments of the present disclosure overcome or mitigate at least some of the drawbacks of the related art and provide a pyro igniter circuit that allows for a thorough and complete check of the entire pyro igniter circuit.

Embodiments of the present disclosure seek to solve at least one of the problems existing in the related art to at least some extent. For example, a pyro igniter circuit includes: a shunt resistor electrically connected in series with a power line. The circuit further includes an amplifier having first and second inputs respectively electrically connected to first and second terminals of the shunt resistor and a pyro igniter disconnect element electrically connected to an output of the amplifier and configured to cut the power line based on an ignition control signal received from the output of the amplifier. The circuit further includes a coupling resistor electrically interconnected between an input of the amplifier and one of the terminals of the shunt resistor. The circuit further includes a supervisory circuit electrically connected to a node, the node being interconnected between an input of the amplifier and the coupling resistor. The supervisory circuit is configured to: transmit a test signal to the node, and the test signal may have pulse duration time below an igniter activation pulse time of the pyro igniter disconnect element and/or the ignition control signal, in response to the transmitted test signal, may have an amplitude below an igniter activation amplitude of the pyro igniter disconnect element; and receive a diagnostic response signal in response to the transmitted test signal.

A supervisory circuit may be an integrated part of a microcontroller or may be separately provided. In some embodiments, the amplifier may an amplifying comparator. The amplifier amplifies a signal transmitted to the inputs of (e.g., input to) the amplifier. The coupling resistor functions to provide a voltage drop or, in other words, a voltage offset at one input of the amplifier in response to the transmitted test signal. The test signal may be a voltage signal or a current signal. For example, a current signal causes a voltage drop at the coupling resistor. The coupling resistor may be a test resistor. The receiving of the diagnostic response signal may be performed with a short time delay or in a time window after the transmission of the test signal. The pyro igniter disconnect element may include passive or active electronic elements. For example, the pyro igniter disconnect element may include an ignition wire or heating wire. In some embodiments, the pyro igniter disconnect element may include internal transistors as active electronic elements.

When using a short enough test signal and/or a small enough signal amplitude, the pyro igniter disconnect element is not activated or is not released such that the entire circuit can be checked via the transmitted test signal and received response signal. As one example, the pulse duration time is below (or less than) an igniter activation pulse time of the pyro igniter disconnect element, and the pulse duration can be readily controlled and generated by the supervisory circuit. As another example, the ignition control signal in response to the transmitted test signal has an amplitude below an igniter activation amplitude of the pyro igniter disconnect element, but this example includes that, when configuring the test signal, the gain of the amplifier must be considered to generate an ignition control signal having an amplitude below an activation threshold. As another example, both cases are fulfilled, and this example provides an even more reliable solution to prevent or mitigate a release or activation of the pyro igniter disconnect element. Further, the testing does not interfere with the functionality of the pyro igniter circuit because at any time an over current can activate the pyro disconnect element. Further, the testing is fast and analogue without use of a slow software interaction. Further, the test pulse is readily adjustable such that amplitude or pulse duration can be tailored and adjusted to the requirements of the underling pyro igniter circuit.

In one embodiment, the supervisory circuit may be electrically connected to the output of the amplifier to receive the ignition control signal in response to the transmitted test signal. Thereby, the voltage of the ignition control signal can be tested. For example, the voltage of the ignition control signal contains information on if the amplifier has amplified the transmitted test signal correctly such that the amplifier and the amplifying function can thereby be tested by the supervisory circuit.

The pyro igniter circuit may further include a first current sensor configured to measure an electric current on an output line between the output of the amplifier and the pyro igniter disconnect element and transmit a first current signal indicative of the measured electric current to the supervisory circuit. The measured electric current provides information on if the pyro igniter disconnect element has fired already, is not connected, or if an ignition wire or active electronic components of the pyro igniter disconnect element such as, for example, internal transistors have failed. An indication for a failure or a missing pyro igniter would be no or a very low current in response to the transmitted test signal.

In one embodiment, the pyro igniter circuit may further comprise a second current sensor configured to measure an electric current at the node in response to the transmitted test signal and transmit a second current signal indicative of the measured electric current to the supervisory circuit. The information of this electric current may be that the shunt resistor is functioning and/or electrically connected properly. Thereby, the circuit part including the shunt resistor is tested. For example, when no current is detected, the shunt resistor may not be correctly connected.

The pulse duration time may be below about 20 μs, below about 10 μs, or below about 1 μs. In such cases, an accidental release or activation of the pyro igniter element can be prevented or rendered highly unlikely. The pulse duration time may be $\frac{1}{10}$, $\frac{1}{100}$, or $\frac{1}{1000}$ of the igniter activation pulse time.

In one embodiment, the test signal has a pulse duration time below an igniter activation pulse time of the pyro igniter disconnect element and the ignition control signal, in response to the transmitted test signal, may have an amplitude above an igniter activation amplitude of the pyro igniter disconnect element. Due to the short pulse duration of the transmitted test signal, the pyro igniter disconnect element is also in this case not activated/released. The amplitude may be, for example, a voltage or a current amplitude.

In another example, the test signal has a pulse duration time above an igniter activation pulse time of the pyro igniter disconnect element and the ignition control signal, in response to the transmitted test signal, may have an amplitude below an igniter activation amplitude of the pyro igniter disconnect element. In such a case, the amplitude is controlled such that even with longer pulse duration an activation or release of the pyro igniter disconnect element does not occur. The amplitude may be a voltage or a current amplitude.

In one embodiment, the supervisory circuit may be configured to compare the received diagnostic response signal with the transmitted test signal. The comparison allows for detecting various faults in the circuitry as described above. As used herein, "compare" may include evaluating and verifying.

The supervisory circuit may be configured to generate a state signal based on the comparison of the ignition control signal and the transmitted test signal. The state signal may be used as a warning signal or a control signal for disconnecting or shut down of the battery or similar purposes.

According to another embodiment of the present disclosure, a testing method for testing a pyro igniter circuit is provided. The method includes the steps of: providing a shunt resistor connected in series with a power line, an amplifier having first and second inputs respectively electrically connected to first and second terminals of the shunt resistor, a pyro igniter disconnect element electrically connected to an output of the amplifier and configured to cut the power line based on an ignition control signal received from the output of the amplifier, a coupling resistor electrically interconnected between one of the inputs of the amplifier and one of the terminals of the shunt resistor. The method further includes a step of transmitting a test signal to a node interconnected between an input of the amplifier and the coupling resistor. The test signal may have a pulse duration time below an igniter activation pulse time of the pyro igniter disconnect element and/or the ignition control signal, in response to the transmitted test signal, may have an amplitude below an igniter activation amplitude of the pyro igniter disconnect element. The method may further include a step of receiving a diagnostic response signal in response to the transmitted test signal.

The aspects and features of the corresponding test method, and manner of carrying it out, can be inferred from the aspects and features of the pyro igniter circuit as disclosed above and further below.

The method may further include receiving the ignition control signal at the output of the amplifier in response to the transmitted test signal.

In one embodiment, the method may further include measuring an electric current on an output line between the output of the amplifier and the pyro igniter disconnect element in response to the transmitted test signal and transmitting a first current signal indicative of the measured electric current to the supervisory circuit.

The method may further include measuring of an electric current at the node in response to the transmitted test signal and transmit a second current signal indicative of the measured electric current to the supervisory circuit.

The method may further include a step of comparing the received ignition control signal with the transmitted test signal and generating a state signal based on the comparison of the ignition control signal and the transmitted test signal.

According to another embodiment of the present disclosure, a battery system includes a pyro igniter circuit according to one of the above embodiments and a plurality of battery cells electrically connected to the power line.

In another embodiment of the present disclosure, an electric vehicle including a battery system according to the embodiments of the present disclosure is provided.

Further aspects and features of the present disclosure could be learned from the dependent claims and/or the following description.

BRIEF DESCRIPTION OF THE DRAWINGS

Aspects and features of the present disclosure will become apparent to those of ordinary skill in the art by describing, in detail, example embodiments with reference to the attached drawings in which.

DETAILED DESCRIPTION

Figure 1:
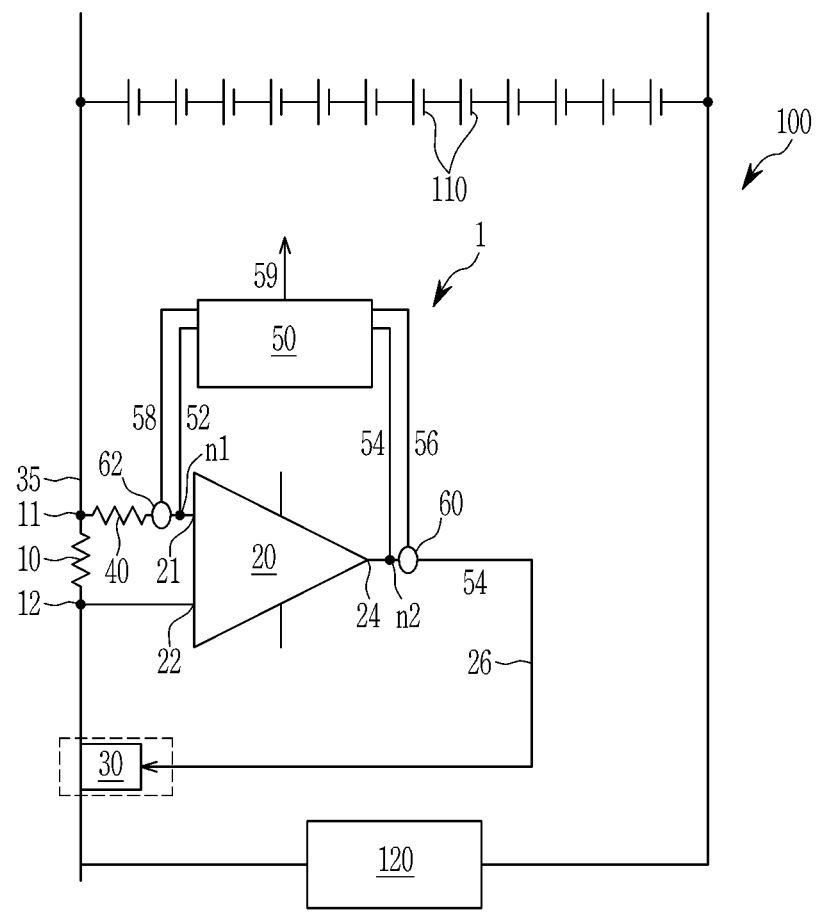
FIG. 1 illustrates a schematic view of a pyro igniter circuit and a battery system according to an embodiment of the present disclosure.

Reference will now be made, in detail, to embodiments, examples of which are illustrated in the accompanying drawings. Aspects and features of the example embodiments, and implementation methods thereof, will be described with reference to the accompanying drawings. In the drawings, like reference numerals denote like elements, and redundant descriptions thereof may be omitted. As used herein, the term "and/or" includes any and all combinations of one or more of the associated listed items. Further, the use of "may" when describing embodiments of the present disclosure refers to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

In the following description of embodiments of the present disclosure, the terms of a singular form may include plural forms unless the context clearly indicates otherwise.

It will be further understood that the terms "include," "comprise," "including," or "comprising" specify a property, a region, a fixed number, a step, a process, an element, a component, and a combination thereof but do not exclude other properties, regions, fixed numbers, steps, processes, elements, components, and combinations thereof.

Features of the inventive concept and methods of accomplishing the same may be understood more readily by reference to the following detailed description of embodiments and the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise.

FIG. 1 shows a battery system 100 including a pyro igniter circuit 1 according to an embodiment of the present disclosure. The pyro igniter circuit 1 includes a shunt resistor 10, which is connected in series with a power line 35. The shunt resistor 10 may be a low impedance shunt. For example, the shunt resistor 10 may have a resistance of less than about 100 μΩ or less than about 500 μΩ, but the present disclosure is not restricted thereto.

The power line 35 may be connected to a plurality of battery cells 110 of the battery system 100. In the illustrated example, the battery cells 110 are electrically connected with each other in series and electrically connected in parallel to the power line 35, but the present disclosure is not restricted thereto. The plurality of battery cells 110 may provide power to the power line 35 in terms of an electrical voltage and an electrical current. The battery cells 110 of the battery system 100 may also be charged via the power line 35. The provided voltage may be up to about 400 V or even up to about 800 V in total, for example, and about 4 V per battery cell 110, for example, but the present disclosure is not restricted thereto. The number of battery cells 110 is provided only as example, and the present disclosure is not restricted thereto. A load 120 may be electrically connected to the power line 35 to be supplied with the power from the battery cells 110. The load 120 may be any suitable component of an electrical vehicle requiring electric power.

The pyro igniter circuit 1 includes an amplifier 20. The amplifier 20 has inputs 21, 22 respectively electrically connected to terminals 11, 12 of the shunt resistor 10. The amplifier 20 functions to provide an ignitor control signal 54 based on a signal (e.g., a voltage) that is transmitted to the inputs 21, 22 of the amplifier 20. The amplifier 20 may be supplied with power to provide the amplifying function.

The pyro igniter circuit 1 further includes a pyro igniter disconnect element 30. The pyro igniter disconnect element 30 may include passive and/or active electronic elements. For example, the pyro igniter disconnect element 30 may include an ignition wire or heating wire. In some embodiments, the pyro igniter disconnect element may include internal transistors as active electronic elements. The pyro igniter disconnect element 30 is electrically connected to an output 24 of the amplifier 20. The pyro igniter disconnect element 30 cuts or isolates the power line 35 based on an ignition control signal 54 received from the output 24 of the amplifier 20. The pyro igniter disconnect element 30 may be referred to as pyro-fuse or pyro-fuse element.

When a current above a threshold current flows through the shunt resistor 10, a voltage drops off at the terminals 11, 12 of the shunt resistor 10 and, thus, at the inputs 21, 22 of the amplifier 20. Such situations occur in severe system faults or short circuits. The ignition control signal 54 is then generated by the amplifier 20. Only when the ignition control signal 54 has sufficient amplitude and pulse duration is sufficient energy transferred to release or activate the pyro igniter disconnect element 30, which will eventuate in a cut or an isolation of the power line 35 due to a pyro reaction. Then, the load 120 is isolated from the power line 35.

The pyro igniter circuit 1 further includes a coupling resistor 40 electrically interconnected between the first input 21 of the amplifier 20 and the first terminal 11 of the shunt resistor 10. The coupling resistor 40 may have a resistance in a range from about 1 kΩ to about 10 kΩ or about 1 kΩ to about 100 kO, but the present disclosure is not restricted thereto.

Further, the pyro igniter circuit 1 includes a supervisory circuit 50. The supervisory circuit 50 is electrically connected to a first node n1. The first node n1 is interconnected between the first input 21 of the amplifier 20 and the coupling resistor 40. The supervisory circuit 50 is configured to transmit a test signal 52 to the first node n1. The supervisory circuit 50 is configured to generate the test signal 52 according to the conditions (or alternatives) illustrated in FIG. 2 and described in more detail below. The test signal 52 may be voltage pulse signal or a current pulse signal.

Figure 2:
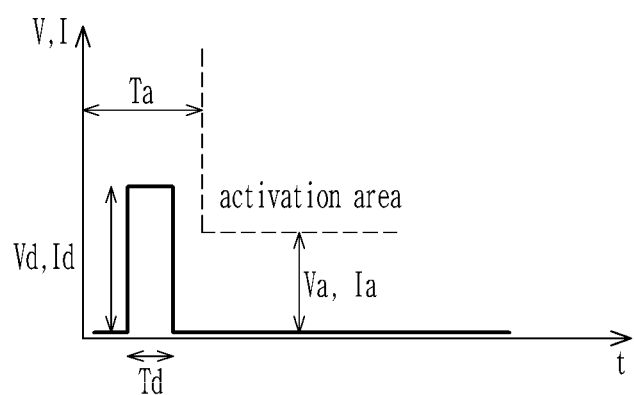
FIG. 2 illustrates a test signal pulse according to an embodiment of the present disclosure.

In a first embodiment, the generated test signal 52 has a pulse duration time Td below (e.g., that is less than) an igniter activation pulse time Ta of the pyro igniter disconnect element 30. The pulse duration time Td being below the igniter activation pulse time Ta of the pyro igniter disconnect element 30 can be readily controlled by the supervisory circuit 50 by controlling (e.g., by only controlling) the pulse duration when the test signal 52 is generated. As shown in FIG. 2, when the pulse duration time Td is below an igniter activation pulse time Ta, the corresponding ignition control signal 54 cannot release or activate the pyro igniter disconnect element 30 even if the amplitude Vd, Id is above an igniter activation amplitude Va, Ia of the pyro igniter disconnect element 30. The activation area is schematically shown in FIG. 2 by dashed lines. Therefore, the pyro igniter circuit 1 can be completely tested by the test signal 52. The test can be done without dead time because an over current event can always trigger the pyro igniter disconnect element 30. The pulse duration time Td may be less than about 20 μs, below about 10 μs, or below about 1 μs to ensure that the pulse is short enough that is does not activate the pyro igniter disconnect element 30. The pulse duration time Td may be for example 1/10, 1/100, or 1/1000 of the igniter activation pulse time Ta.

In a second embodiment, the test signal 52 is generated by the supervision circuit 50 such that the ignition control signal 54, in response to the transmitted test signal 52, has an amplitude Vd, Id below the igniter activation amplitude Va, Ia of the pyro igniter disconnect element 30. In this embodiment, the test signal 52 may be generated based on a pre-known (or pre-set) amplifying strength of the amplifier 20. In such an embodiment, the pulse duration time Td may be below or above (or less than or greater than) the igniter activation pulse time Ta of the pyro igniter disconnect element 30. Thus, the amplitude Vd, Id may be too small to activate or release the pyro igniter disconnect element 30 (see, e.g., FIG. 2).

In another embodiment, both cases are fulfilled. For example, the generated test signal 52 has a pulse duration time Td below the igniter activation pulse time Ta of the pyro igniter disconnect element 30 and the test signal 52 is generated such that the ignition control signal 54, in response to the transmitted test signal 52, has an amplitude Vd, Id below the igniter activation amplitude Va, Ia of the pyro igniter disconnect element 30 (see, e.g., FIG. 2).

The supervisory circuit 50, after transmitting the test signal 52, receives a diagnostic response signal 54, 56, 58 in response to the transmitted test signal 52. The supervisory circuit 50 may receive the diagnostic response signal 54, 56, 58 a short time delay after the transmission of the test signal 52 or in a consecutive time window after the transmission of the test signal 52. Some examples of particular diagnostic response signals 54, 56, 58 are provided below. When the test signal 52 fulfills one or more of the above-described conditions, for example, that the pulse duration time Td is below an igniter activation pulse time Ta as shown in FIG. 2, the pyro igniter disconnect element 30 does not activate or release. Therefore, the functionality of the complete pyro igniter circuit 1 can be tested. Further, the testing does not interfere with the functionality of the pyro igniter circuit 1 because at all times an over current can activate the pyro igniter disconnect element 30. Further, the testing is fast and analogue without a slow software interaction. Further, the test pulse can be readily adjusted such that amplitude or pulse duration can be adjusted to the requirements of the underlying pyro igniter circuit 1.

The supervisory circuit 50 may be electrically connected to the output 24 of the amplifier 20. For example, supervisory circuit 50 may be electrically connected to a second node n2 of an output line 26 connected to the amplifier output 24. The supervisory circuit 50 may thus receive the ignition control signal 54 in response to the transmitted test signal 52 to the first node n1. For example, the amplitude (e.g., the amplified voltage) Vd of the amplified test signal 52 may be transmitted to the supervisory circuit 50. Thereby, the functionality of the amplifier 20, for example, the correct gain, the connections, or the power supply to the amplifier 20 may be checked when the ignition control signal 54 is received by the supervisory circuit 50.

The pyro igniter circuit 1 may include a first current sensor 60. The first current sensor 60 may be configured to measure an electric current on the output line 26 between the output 24 of the amplifier 20 and the pyro igniter disconnect element 30. The first current sensor 60 may transmit a first current signal 56, indicative of the measured electric current, to the supervisory circuit 50. The measured current may be a direct indicator of the functionality and presence of the pyro igniter disconnect element 30, the latter schematically shown in FIG. 1. For example, the measured current is low or minimized when the pyro igniter disconnect element 30 has a fault, is not present, has already been activated, or one of the components therein like transistors are functioning incorrectly.

The pyro igniter circuit 1 may include a second current sensor 62. The second current sensor 62 may be configured to measure an electric current on the first node n1 that is interconnected between the first input 21 and the coupling resistor 40. The current may be measured in response to the transmitted test signal 52. The second current sensor 62 may transmit the second current signal 58 indicative of the measured electric current to the supervisory circuit 50. Thereby, the functionality of the shunt resistor 10 may be checked because a current can only flow when the shunt resistor 10 is correctly connected because the current cannot flow into the amplifier 20. The first current sensor 60 and the second current sensor 62 may be any suitable sensor capable of sensing currents.

Referring to FIG. 2, in embodiments of the present disclosure, the ignition control signal 54, in response to the transmitted test signal 52, may have an amplitude Vd, Id above (or greater than) the igniter activation amplitude Va, Ia of the pyro igniter disconnect element 30 while the pulse duration time Td is below (or less than) the igniter activation pulse time Ta. In such a case, the pyro igniter disconnect element 30 may not be activated or released.

In another embodiment of the present disclosure, the ignition control signal 54, in response to the transmitted test signal 52, may have an amplitude Vd, Id below the igniter activation amplitude Va, Ia of the pyro igniter disconnect element 30 while the pulse duration time Td is above the igniter activation pulse time Ta. The amplitude Vd may be a voltage or a current Id.

The supervisory circuit 50 may be further configured to compare the received diagnostic response signal 54, 56, 58 with the transmitted test signal 52. Thereby, the supervisory circuit 50 can detect any faults of the entire pyro igniter circuit 1 as disclosed above.

The supervisory circuit 50 may further generate a state signal 59 based on the comparison of the diagnostic response signal 54, 56, 58 and the transmitted test signal 52. The state signal 59 may be used for disconnecting or shutting down of the battery or for warning purposes.

Figure 3:
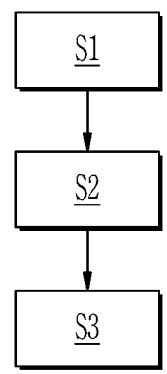
FIG. 3 is a block diagram illustrating a testing method according to an embodiment of the present disclosure.

FIG. 3 schematically shows a testing method for testing a pyro igniter circuit according to an embodiment of the present disclosure. In a step S1, the method includes providing a shunt resistor 10 connected in series with a power line 35, an amplifier 20 comprising inputs 21, 22 respectively electrically connected to terminals 11, 12 of the shunt resistor 10, a pyro igniter disconnect element 30 electrically connected to an output 24 of the amplifier 20 and configured to cut the power line 35 based on an ignition control signal 54 received from the output 24 of the amplifier 20, a coupling resistor 40 electrically interconnected between a first input 21 of the amplifier 20 and a terminal 11 of the shunt resistor 10.

In a step S2, the method includes transmitting a test signal 52 to a node n1 interconnected between the first input 21 of the amplifier 20 and the coupling resistor 40. The test signal 52 has a pulse duration time Td below an igniter activation pulse time Ta of the pyro igniter disconnect element 30 and/or the ignition control signal 54, in response to the transmitted test signal 52, has an amplitude Vd, Id below an igniter activation amplitude Va, Ia of the pyro igniter disconnect element 30.

In a third step S3, the method includes receiving a diagnostic response signal 54, 56, 58 in response to the transmitted test signal 52.

Further aspects and features of the schematically disclosed method are disclosed in the above description of the corresponding pyro igniter circuit 1 and are hereby incorporated by reference.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the example embodiments of the present disclosure.

SOME REFERENCE SIGNS 1 pyro igniter circuit
10 shunt resistor
11 first terminal
12 second terminal
20 amplifier
21 first input
22 second input
24 output
26 output line
30 pyro igniter disconnect element
35 power line
40 coupling resistor
50 supervisory circuit
52 test signal
54 ignition control signal
56 first current signal
58 second current signal
60 first current sensor
62 second current sensor
Td pulse duration time
Ta igniter activation pulse time
Vd voltage amplitude
Id current amplitude
Va igniter activation voltage amplitude
Ia igniter activation current amplitude
100 battery system
110 battery cells
120 load
n1 first node
n2 second node
S1 first step
S2 second step
S3 third step

What is claimed is:

1. A pyro igniter circuit comprising:
  a shunt resistor connected in series with a power line;
  an amplifier having first and second inputs respectively electrically connected to first and second terminals of the shunt resistor;
  a pyro igniter disconnect element electrically connected to an output of the amplifier and configured to cut the power line based on an ignition control signal received from the output of the amplifier;
  a coupling resistor electrically interconnected between the first input of the amplifier and the first terminal of the shunt resistor; and
  a supervisory circuit electrically connected to a node, the node being interconnected between the first input of the amplifier and the coupling resistor,
  wherein the supervisory circuit is configured to:
    transmit a test signal to the node, the test signal having a pulse duration time below an igniter activation pulse time of the pyro igniter disconnect element and/or the ignition control signal, in response to the transmitted test signal, has an amplitude below an igniter activation amplitude of the pyro igniter disconnect element; and
    receive a diagnostic response signal in response to the transmitted test signal.

2. The pyro igniter circuit of claim 1, wherein the supervisory circuit is electrically connected to the output of the amplifier to receive the ignition control signal in response to the transmitted test signal.

3. The pyro igniter circuit of claim 1, further comprising a first current sensor configured to:
  measure an electric current on an output line between the output of the amplifier and the pyro igniter disconnect element; and
  transmit a first current signal as the diagnostic response signal indicative of the measured electric current to the supervisory circuit.

4. The pyro igniter circuit of claim 1, further comprising a second current sensor configured to:
  measure an electric current at the node in response to the transmitted test signal; and
  transmit a second current signal as the diagnostic response signal indicative of the measured electric current to the supervisory circuit.

5. The pyro igniter circuit of claim 1, wherein the pulse duration time is less than 20 μs.

6. The pyro igniter circuit of claim 5, wherein the pulse duration time is less than 10 μs.

7. The pyro igniter circuit of claim 6, wherein the pulse duration time is less than 1 μs.

8. The pyro igniter circuit of claim 1, wherein the pulse duration time of the test signal is below the igniter activation pulse time of the pyro igniter disconnect element, and the ignition control signal, in response to the transmitted test signal, has an amplitude above the igniter activation amplitude of the pyro igniter disconnect element.

9. The pyro igniter circuit of claim 1, wherein the pulse duration time of the test signal is above the igniter activation pulse time of the pyro igniter disconnect element, and the ignition control signal, in response to the transmitted test signal, has an amplitude below an igniter activation amplitude of the pyro igniter disconnect element.

10. The pyro igniter circuit of claim 1, wherein the supervisory circuit is configured to compare the received diagnostic response signal with the transmitted test signal.

11. The pyro igniter circuit of claim 10, wherein the supervisory circuit is configured to generate a state signal based on the comparison of the received diagnostic response signal and the transmitted test signal.

12. A battery system comprising the pyro igniter circuit according to claim 1 and a plurality of battery cells electrically connected to the power line.

13. An electric vehicle comprising the battery system according to claim 12.

14. A testing method for testing a pyro igniter circuit, the pyro igniter circuit comprising a shunt resistor connected in series with a power line, an amplifier comprising first and second inputs respectively electrically connected to first and second terminals of the shunt resistor, a pyro igniter disconnect element electrically connected to an output of the amplifier and configured to cut the power line based on an ignition control signal received from the output of the amplifier, a coupling resistor electrically interconnected between the first input of the amplifier and the first terminal of the shunt resistor, the method comprising:

transmitting a test signal to a node, the node being interconnected between the first input of the amplifier and the coupling resistor, the test signal having a pulse duration time below an igniter activation pulse time of the pyro igniter disconnect element and/or the ignition control signal, in response to the transmitted test signal, having an amplitude below an igniter activation amplitude of the pyro igniter disconnect element; and receiving a diagnostic response signal in response to the transmitted test signal.

15. The method of claim 14, further comprising receiving an ignition control signal as the diagnostic response signal from the output of the amplifier in response to the transmitted test signal.

16. The method of claim 14, further comprising:

measuring an electric current on an output line between the output of the amplifier and the pyro igniter disconnect element in response to the transmitted test signal; and transmitting a first current signal as the diagnostic response signal indicative of the measured electric current to a supervisory circuit.

17. The method of claim 14, further comprising:

measuring an electric current at the node in response to the transmitted test signal; and transmitting a second current signal as the diagnostic response signal indicative of the measured electric current to a supervisory circuit.

\* \* \* \* \*